(12) United States Patent
Schmidt

(10) Patent No.: US 6,797,981 B2
(45) Date of Patent: Sep. 28, 2004

(54) TEST WAFER AND METHOD FOR PRODUCING THE TEST WAFER

(75) Inventor: Michael Schmidt, Markt Schwaben (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/268,203

(22) Filed: Oct. 10, 2002

(65) Prior Publication Data

US 2003/0068835 A1 Apr. 10, 2003

(30) Foreign Application Priority Data

Oct. 10, 2001 (DE) .......................................... 101 49 885

(51) Int. Cl.[7] .............................................. H01L 23/58
(52) U.S. Cl. .......................... 257/48; 257/459; 257/501; 257/534; 257/623; 438/14; 438/18
(58) Field of Search .............. 438/14, 18; 257/E23.179, 257/E21.524, 501, 459, 48, 534, 623, E21.521

(56) References Cited

U.S. PATENT DOCUMENTS 5,302,491 A    4/1994  Akylas et al.
6,605,852 B2 *  8/2003  Mori et al. .................. 257/459

FOREIGN PATENT DOCUMENTS

DE    100 14 914 A1    10/2001

OTHER PUBLICATIONS

Jarvis, R.W. et al.: "Use of Intentional Defect Wafers for Tool Inspection Validation", Proceedings of SPIE, vol. 3998, 2000, pp. 302–307.
Van Zant, P.: "Microchip Fabrication", McGraw Hill, 4th Edition , 2000, pp. 70 and 452.

* cited by examiner

Primary Examiner—W. David Coleman
Assistant Examiner—Khiem D Nguyen
(74) Attorney, Agent, or Firm—Laurence A. Greenberg; Werner H. Stemer; Ralph E. Locher

(57) ABSTRACT

A test wafer is provided, in particular for use in monitoring inspection installations for semiconductor fabrication that are based on the analysis of scattered or reflected radiation. The test wafer is subdivided into a multiplicity of regularly disposed chip fields. The test wafer is characterized in that the test wafer has at least a first type of structures, which are disposed chip-field-periodically, and at least a second type of structures, which are disposed non-chip-field-periodically at predetermined locations on the test wafer.

7 Claims, 3 Drawing Sheets

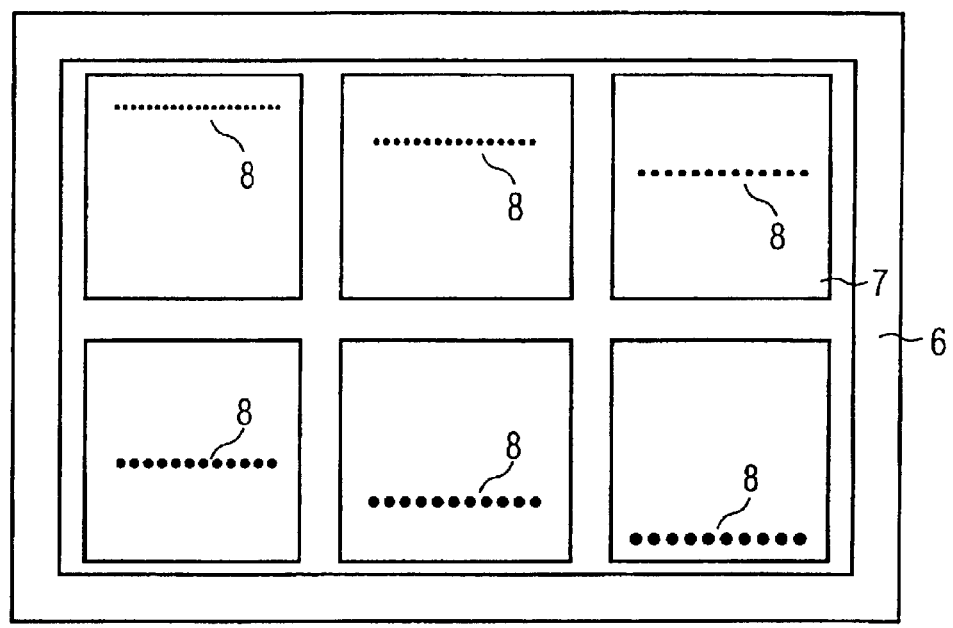
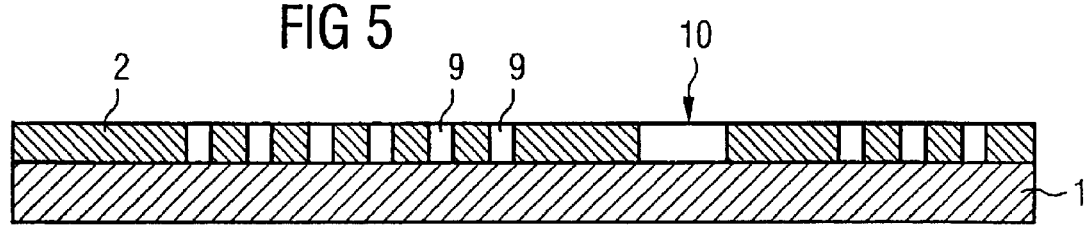
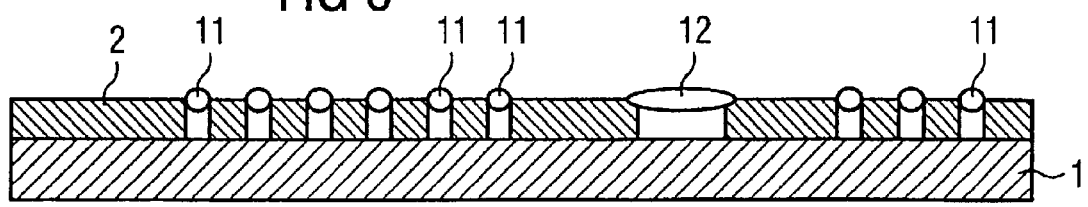

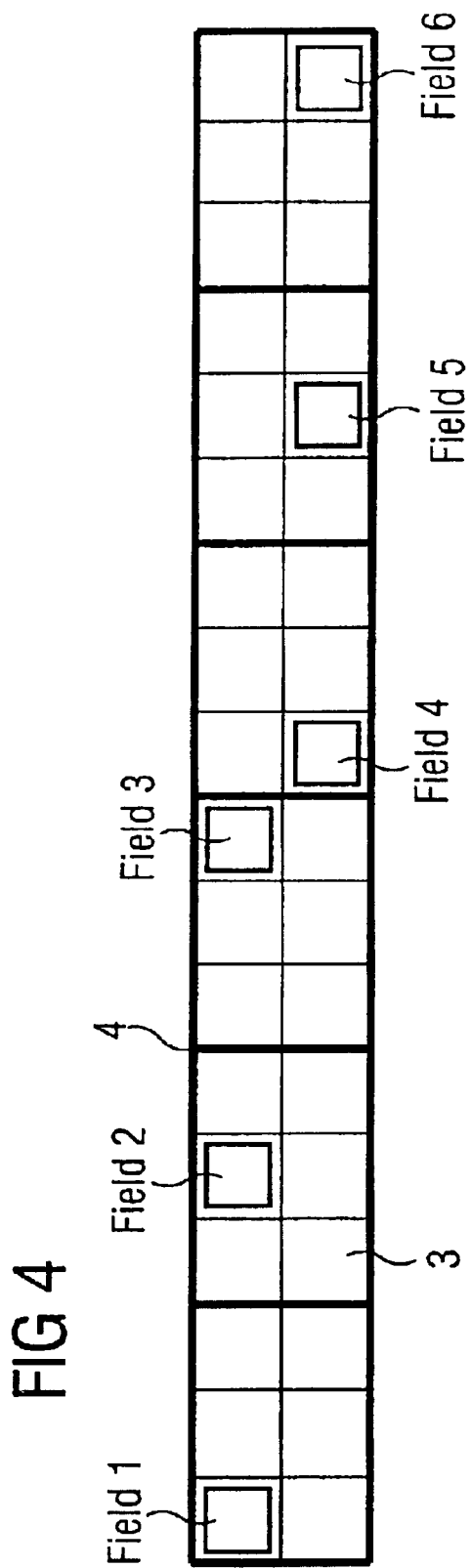

TEST WAFER AND METHOD FOR PRODUCING THE TEST WAFER

BACKGROUND OF THE INVENTION

Field of the Invention

The present invention relates to test wafers and a method for producing test wafers. The present invention relates, in particular, to test wafers having programmed defects, preferably with a topology.

The assessment of the stability of inspection installations for measuring defect densities in semiconductor fabrication is usually done by standardized inspections on test wafers that contain programmed defects. The defects are already programmed in the corresponding lithography mask and are transferred to the test wafer. Due to the production process, however, the defects are structural defects with no topology. Since structural defects are normally more difficult to detect than bearing material with topology, this is not a problem. After all, the tests are carried out on the more critical defect types. If these tests are within the specification, then the inspection installation is also able in any event to detect the less critical bearing defects.

In order to ensure effective installation monitoring of the individual process installations, new inspection installations which are selectively sensitive to bearing material and, dictated by technology, can detect structural defects only incompletely or with a very high outlay have recently become commercially available to an increased extent. The inspection installations utilize radiation which is reflected or scattered by topological defects on the wafer surface when the wafer surface is irradiated for example by one or more lasers. Since the entire wafer surface is examined in a method of this type, a very large volume of data is produced, and this must be reduced to a manageable amount by suitable algorithms. To that end, it is usually the case that all the signals that have a period corresponding to the period of the individual chips on the wafer are removed from the measurement data. It is assumed in this case that, for example, dust particles disposed on different chips are not disposed at the same locations in each case on the chips, such that a periodic configuration of the dust particles would arise.

In order to monitor such inspection installations with regard to their sensitivity and stability, product wafers taken from the production process are generally used. However, this procedure entails a series of disadvantages. The product wafers used for test purposes generally have a lifetime of about 4 months in the production process. Afterward, they are usually contaminated in such a way that they have to be replaced by new wafers. Since product wafers are relatively expensive, significantly increased test costs thus result. Furthermore, each product wafer is unique with regard to its defects. The consequence of this is that it is not possible to carry out stable monitoring with uniform specifications on structurally identical inspection installations.

SUMMARY OF THE INVENTION

It is accordingly an object of the invention to provide a test wafer and a method for producing the test wafer that overcome the above-mentioned disadvantages of the prior art devices and methods of this general type.

With the foregoing and other objects in view there is provided, in accordance with the invention, a test wafer used for monitoring inspection installations used in semiconductor fabrication processes and an inspection analysis being based on an analysis of one of scattered radiation and reflected radiation. The test wafer contains a wafer surface, a multiplicity of regularly disposed chip fields defined over the wafer surface, structures of a first type disposed chip-field-periodically at first predetermined locations over the wafer surface, and structures of a second type disposed non-chip-field-periodically at second predetermined locations over the wafer surface.

The invention provides a test wafer, in particular for monitoring inspection installations for semiconductor fabrication which are based on the analysis of scattered or reflected radiation, the test wafer being subdivided into a multiplicity of regularly disposed chip fields. The test wafer according to the invention is characterized in that the test wafer has structures of a first type, which are disposed chip-field-periodically, and structures of a second type that are disposed non-chip-field-periodically at predetermined locations on the test wafer.

Furthermore, the invention provides a method for producing the test wafer, which has the following steps:
 a) a substrate is provided;
 b) a photoresist layer is applied;
 c) a first irradiation of the photoresist layer is carried out chip-field-periodically using a first mask, which corresponds to the structures of the first type;
 d) a second irradiation of the photoresist layer is carried out non-chip-field-periodically using at least a second mask, which corresponds to structures of the second type;
 e) the photoresist layer is developed to form a resist mask; and
 f) structures are produced in accordance with the resist mask, so that the test wafer has the structures of the first, which are disposed chip-field-periodically, and the structures of the second type, which are disposed non-chip-field-periodically at predetermined locations on the test wafer.

The test wafer according to the invention has the advantage that it can be used to ensure stable and reproducible monitoring with uniform specifications on structurally identical inspection installations that are based on the analysis of scattered or reflected radiation. In this case, the test wafer according to the invention can be used to check not only the "physical" behavior of the inspection installations but also the mode of operation of the algorithms used for data reduction. Furthermore, the test wafer according to the invention can be produced simply and cost-effectively by largely standardized process steps with the aid of the method according to the invention. In particular, the different types of structures can be produced jointly in a single process sequence after the production of the resist mask.

In accordance with one preferred embodiment, the test wafer is additionally subdivided into a multiplicity of stepper fields which each have a plurality of chip fields and the structures of the second type are disposed non-stepper-field-periodically (not periodically in the stepper field).

In accordance with a further preferred embodiment, the structures of the first type are formed as elevations over the wafer surface. Furthermore, it is preferred if the structures of the second type are formed as elevations over the wafer surface.

In accordance with a further preferred embodiment, the structures of the first and of the second type are formed from the same material. In this case, it is particularly preferred if the structures of the first and of the second type are formed from silicon or silicon oxide.

In accordance with a further preferred embodiment, the structures of the second type have at least two different lateral extents.

In accordance with a preferred embodiment of the method according to the invention, the test wafer is additionally subdivided into a multiplicity of stepper fields each having a plurality of chip fields and, in step c), all the chip fields of a stepper field are irradiated simultaneously.

In accordance with a further preferred embodiment of the method according to the invention, the test wafer is additionally subdivided into a multiplicity of stepper fields each having a plurality of chip fields and, in step d), in each case only one chip field of a stepper field is irradiated.

In accordance with a further preferred embodiment of the method according to the invention, at least one auxiliary layer, preferably silicon nitride, is provided and, in step f), openings are produced in the auxiliary layer in accordance with the resist mask and a selective material deposition is carried out, so that material is deposited essentially only in the openings of the auxiliary layer. In this case, it is particularly preferred if a selective silicon or a selective silicon oxide deposition is carried out.

Other features which are considered as characteristic for the invention are set forth in the appended claims.

Although the invention is illustrated and described herein as embodied in a test wafer and a method for producing the test wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is an illustration of a mask;

FIG. 4 is an illustration of an irradiation pattern;

FIG. 5 is a diagrammatic, sectional view of the test wafer; and

FIG. 6 is a diagrammatic, sectional view of the test wafer.

DESCRIPTION OF THE PREFERRED EMBODIMENTS

Figure 1:
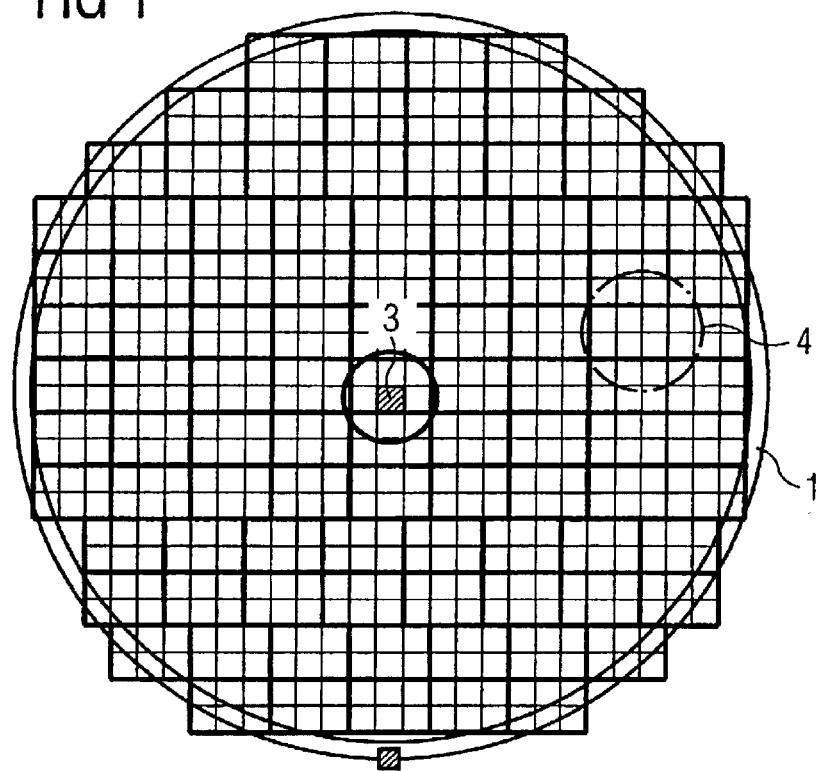
FIG. 1 is a diagrammatic, plan view of an embodiment of a test wafer produced in accordance with a method according to the invention.

Referring now to the figures of the drawing in detail and first, particularly, to FIG. 1 thereof, there is shown, as a starting point of the method, a semiconductor wafer 1, for example a silicon wafer, which is covered by an auxiliary layer 2 (FIG. 2), preferably a silicon nitride layer. Furthermore, the semiconductor wafer 1 is subdivided into chip fields 3 and stepper fields 4. Depending on the configuration of the stepper fields 4 on the semiconductor wafer 1, the stepper fields 4 contain different numbers of chip fields 3. In this case, the chip fields 3 correspond to the regions at which the complete chips are finally produced. The stepper fields 4 correspond to the regions that are usually exposed simultaneously during exposure with a so-called "stepper". In the present example, a stepper field 4 generally contains six of the chip fields 3.

Figure 2:
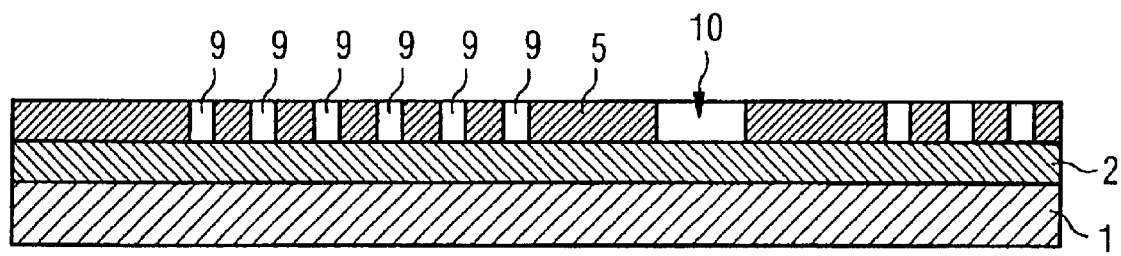
FIG. 2 is a diagrammatic, sectional view of the test wafer.

A photoresist layer 5 is applied to the semiconductor substrate 1 and the auxiliary layer 2, and subsequently undergoes a kind of "double exposure" (FIG. 2). To that end, a first irradiation of the photoresist layer 5 is carried out chip-field-periodically using a first mask, which corresponds to structures of a first type. A stepper moves over the individual stepper fields 4 one after the other and simultaneously irradiates all the chip fields 3 of the stepper field 4.

The mask used for this contains six identical fields with a customary configuration containing a free region (i.e. the nitride remains) at the locations at which the programmed defects (structures of the second type) are later intended to be. A so-called "hard bake" of the photoresist layer 5 is not carried out, in order that a second lithography step can be carried out immediately afterward.

Accordingly, a second irradiation of the photoresist layer 5 is carried out non-chip-field-periodically using at least a second mask (FIG. 3), which corresponds to the structures of the second type. To that end, a mask 6 of the same size as the mask of the first lithography step is used, which likewise contains six fields 7. In contrast to the first mask, however, the second mask 6 does not have identical fields 7, but rather the fields 7 have their openings 8 at different locations in each case. Furthermore, the openings 8 have different diameters, so that the structures of the second type that are thereby produced have different lateral extents.

The irradiation with the aid of the second mask 6 is aligned with the first lithography plane. The programmed defects then lie on the free regions of the first lithography step. They can then be printed onto the desired stepper fields 4. In order to avoid so-called "repeater structures" in the programmed defects, only one chip field 3 is then irradiated, however, in each stepper field 4. Overall, only as many stepper fields 4 are irradiated as the number of fields 7 contained in the second mask 6. A corresponding irradiation pattern is shown in FIG. 4.

Afterward, the photoresist layer 5 irradiated in this way is developed, thereby producing the resist mask shown in FIG. 2, which contains openings 9, corresponding to the structures of the first type, and openings 10, corresponding to the structures of the second type. The resultant structure is shown in FIG. 2.

Afterward, the auxiliary layer 2 is patterned by anisotropic etching using the resist mask 5 and the resist mask 5 is removed. The resultant structure is shown in FIG. 5. A selective material deposition is subsequently carried out, so that material is deposited essentially only in the openings of the auxiliary layer 2. In this case, it is particularly preferred if a selective silicon or a selective silicon oxide deposition is carried out. The resultant structure is shown in FIG. 6.

The test wafer produced in this way accordingly contains the structures 11 of the first type, which are disposed chip-field-periodically, and the structures 12 of the second type, which are disposed non-chip-field-periodically at predetermined locations on the test wafer. Both types of structures are in each case formed as elevations over the wafer surface and can therefore be readily detected by inspection installations based on the analysis of scattered or reflected radiation.

The test wafer according to the invention has the advantage that it can be used to ensure stable and reproducible monitoring with uniform specifications on structurally identical inspection installations that are based on the analysis of scattered or reflected radiation. In this case, the test wafer according to the invention can be used to check not only the "physical" behavior of the inspection installations but also the mode of operation of the algorithms used for data reduction.

I claim:

1. A test wafer used for monitoring inspection installations used in semiconductor fabrication processes and an inspection analysis being based on an analysis of one of scattered radiation and reflected radiation, the test wafer comprising:

a wafer surface;

a multiplicity of regularly disposed chip fields defined over said wafer surface;

structures of a first type disposed chip-field-periodically at first predetermined locations over said wafer surface; and structures of a second type disposed non-chip-field-periodically at second predetermined locations over said wafer surface.

2. The test wafer according to claim 1, further comprising a multiplicity of stepper fields containing in each case a plurality of said chip fields and said structures of said second type are disposed non-stepper-field-periodically.

3. The test wafer according to claim 1, wherein said structures of said first type are elevations disposed over said wafer surface.

4. The test wafer according to claim 1, wherein said structures of said second type are elevations disposed over said wafer surface.

5. The test wafer according to claim 1, wherein said structures of said first type and said structures of said second type are formed from a same material.

6. The test wafer according to claim 5, wherein said structures of said first type and said structures of said second type are formed from silicon or silicon oxide.

7. The test wafer according to claim 1, wherein said structures of said second type have at least two different lateral extents.

* * * * *